(12) United States Patent
Huynh

(10) Patent No.: US 7,244,927 B2
(45) Date of Patent: Jul. 17, 2007

(54) CONTROL PANEL FOR A MOTOR VEHICLE FASCIA, HAVING AT LEAST ONE OPTICALLY CONTROLLED ROTARY ADJUSTMENT KNOB

(75) Inventor: Tan Duc Huynh, Neuilly sur Marne (FR)

(73) Assignee: Valeo Climatisation, La Verriere (FR)

( * ) Notice: Subject to any disclaimer, the term of this patent is extended or adjusted under 35 U.S.C. 154(b) by 219 days.

(21) Appl. No.: 10/968,453

(22) Filed: Oct. 19, 2004

(65) Prior Publication Data

US 2005/0164623 A1  Jul. 28, 2005

(30) Foreign Application Priority Data

Oct. 20, 2003 (FR) .................................. 03 12226

(51) Int. Cl.
*G09G 5/00* (2006.01)
*G05G 11/00* (2006.01)
(52) U.S. Cl. ................... 250/231.13; 359/235
(58) Field of Classification Search ..............................
250/231.13–231.18
See application file for complete search history.

(56) References Cited

U.S. PATENT DOCUMENTS

| 4,074,128 A | 2/1978 | Hanger et al. |
| 4,644,156 A | 2/1987 | Takahashi et al. |
| 4,806,751 A * | 2/1989 | Abe .............................. 359/235 |
| 5,347,123 A | 9/1994 | Jackson et al. |
| 5,672,865 A | 9/1997 | Braun |
| 6,154,201 A * | 11/2000 | Levin .......................... 345/184 |
| 6,181,847 B1 | 1/2001 | Baker et al. |
| 6,232,593 B1 * | 5/2001 | Taniguchi ............... 250/231.13 |
| 2003/0189478 A1 | 10/2003 | Hsiao et al. |
| 2006/0118707 A1 * | 6/2006 | Schaake ................. 250/231.13 |

FOREIGN PATENT DOCUMENTS

| DE | 43 43 304 A | 9/1995 |
| EP | 0 072 386 A | 2/1983 |
| EP | 0 492 621 A | 7/1992 |
| JP | 55-095422 | 7/1980 |
| JP | 55 095422 A | 7/1980 |

\* cited by examiner

*Primary Examiner*—Georgia Epps
*Assistant Examiner*—Tony Ko
(74) *Attorney, Agent, or Firm*—Ronald Courtney

(57) ABSTRACT

The present invention relates to a control panel, in particular for a motor vehicle, provided with at least one rotary button (10) for adjusting a parameter relating to an air stream propelled by a ventilating, heating and/or air conditioning apparatus, characterised in that the said adjusting button (10) is an optical encoder with selective light emission and reception, and comprising a rotatable part (20) protruding from the control panel, and a fixed part (30) co-operating with the moving part (20) for emitting and receiving the light. This control panel is adapted to adjust, for example, the temperature, flow rate or distribution of the said air stream.

7 Claims, 4 Drawing Sheets

Figure 1:
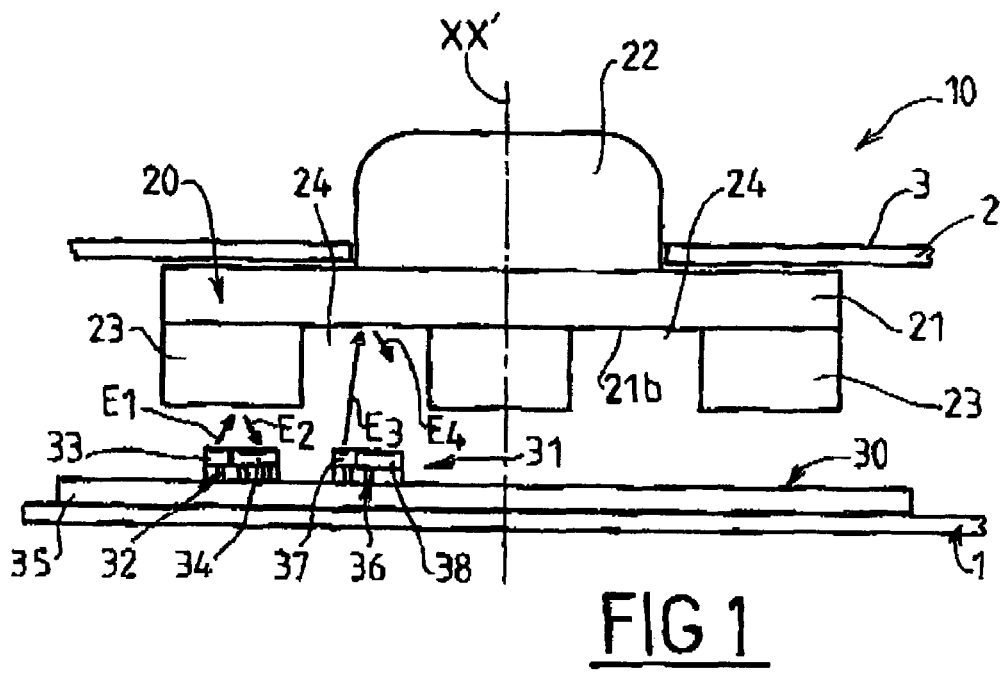

CONTROL PANEL FOR A MOTOR VEHICLE FASCIA, HAVING AT LEAST ONE OPTICALLY CONTROLLED ROTARY ADJUSTMENT KNOB

This invention relates to a control panel for a motor vehicle fascia, having at least one optically controlled rotary adjustment knob.

In current motor vehicles, their fascia panels have, especially in a central console zone which incorporates a control panel, adjusting knobs of apparatus for ventilating, heating and/or air conditioning the cabin. In particular, these consist of rotary knobs which, for example, individually by zone or generally for the whole cabin, enable a parameter such as comfort temperature, or flow and distribution of the air stream propelled by a ventilating, heating and/or air conditioning apparatus fitted in the said fascia panel, to be regulated.

These rotary knobs are generally in two parts: an external movable part which is rotatable and carries programmes or visual symbols, and which is accessible from the fascia panel by the driver or a passenger, together with a fixed part which is disposed underneath the front of the fascia panel and which is connected to an electronic control circuit board with which the moving part is in cooperation. In general, the components soldered to the electronic circuit board are installed with the dimensional manufacturing and positioning tolerances which are suitable for an electronic assembly.

In particular, in the known case of a rotary knob of the incremental type, the optical sensor is mounted on the electronic circuit board and has one end connected to the control knob. Such an arrangement necessitates a very precise dimensional tolerance in order to ensure the cooperation of the optical sensor with the knob. Other dimensional tolerances do exist from the other moulded elements on the electronic circuit board which interact with the face of the control panel. Now, the two parts are usually designed and manufactured, independently from each other, by different methods. The electronic operating stresses linked to the design and fitting of the circuit board do not have any regard to the mechanical operating stresses of the knob, and vice versa. The assembly operation involves dimensional stresses which are very precise in order to give total cooperation of the components with each other. In addition, there exist dimensional stresses between the various elements of the control panel. The totality of these dimensions between the electronic parts which have interfaces with the face of the control panel necessitate fine tolerances.

Any offset of the moving part of the knob with respect to the fixed part may involve an alteration in the adjustment required to the parameter concerned, and accordingly the invention proposes to resolve this problem of alignment and precision of the knob by making use of optical detection.

More precisely, the invention provides a control panel for a motor vehicle, having at least one rotatable knob for adjustment of a parameter relating to a stream of air which is propelled by a ventilating, heating and/or air conditioning apparatus, characterised in that the said control button is an optical encoder with selective emission and reception of light, comprising a rotatable part projecting from the control panel, and a fixed part co-operating with the moving part to emit and receive the light.

Preferably, the fixed part is provided with an optical detection device which comprises at least one light emitter for forming an incident light beam directed towards the moving part, together with at least two optical receivers for intercepting the light beam reflected by the moving part, and for deducing therefrom the angular displacement and direction of rotation of the said moving part with respect to the said fixed part, while the moving part comprises a plurality of radial incremental elements having a reflective surface and consisting of an alternate arrangement of projecting portions and recesses which are disposed on at least one crown which faces towards the optical detection device.

In a first preferred embodiment of the invention:
the optical detection device includes two individual sensors, each of which comprises a light emitter for forming an incident light beam, together with an optical receiver for intercepting the light beams which are reflected by the moving part;
the two sensors are offset radially and/or circumferentially with respect to each other;
the two sensors are substantially diametrically opposed.

In another preferred embodiment of the invention:
the optical detection device comprises, put together in a single block, a light emitter and two optical receivers disposed close to each other over a common circumference;
the projecting portions having a radial dimension which is constant, the detection device is adapted to be positioned with a radial outward or inward offset, from a position which is centred on the radial distance, up to one half of the said radial dimension.

Preferably, the optical receivers are offset circumferentially in such a way that one of the optical receivers receives a light beam reflected by the moving part, while the other optical receiver receives none.

Preferably, the projecting portions are spaced apart from each other at regular intervals.

Figure 2:
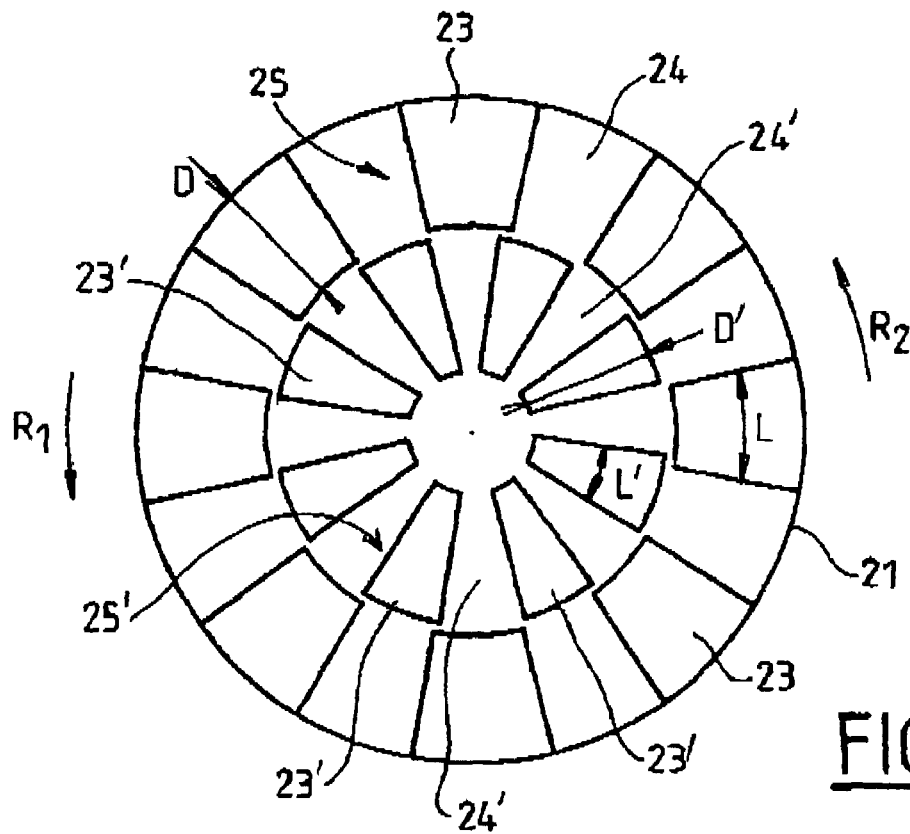
Figure 3:
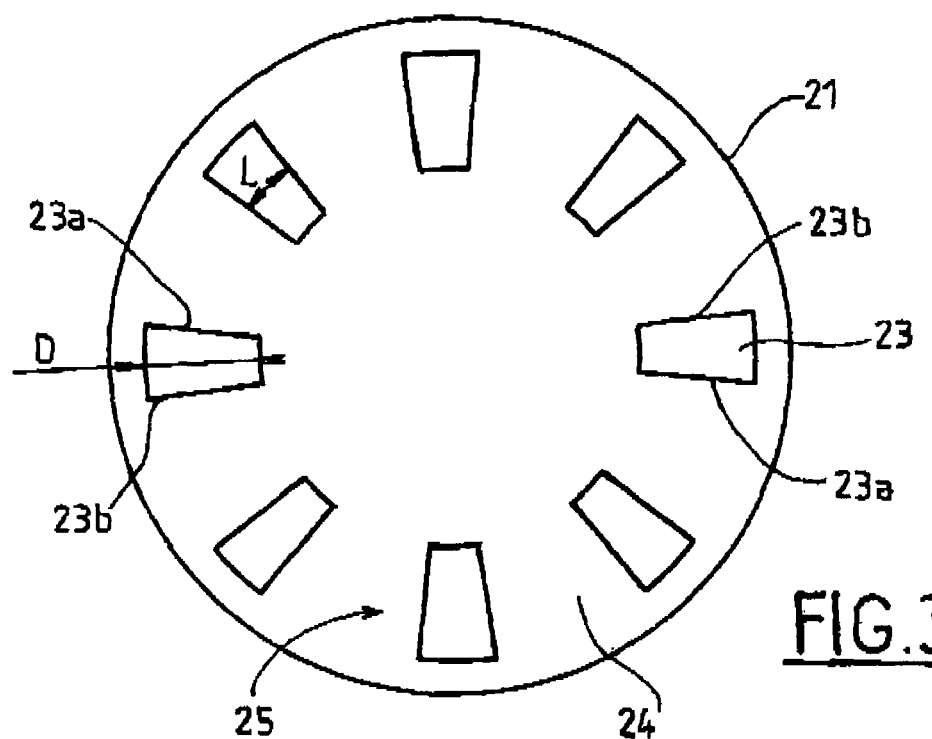
Figure 4:
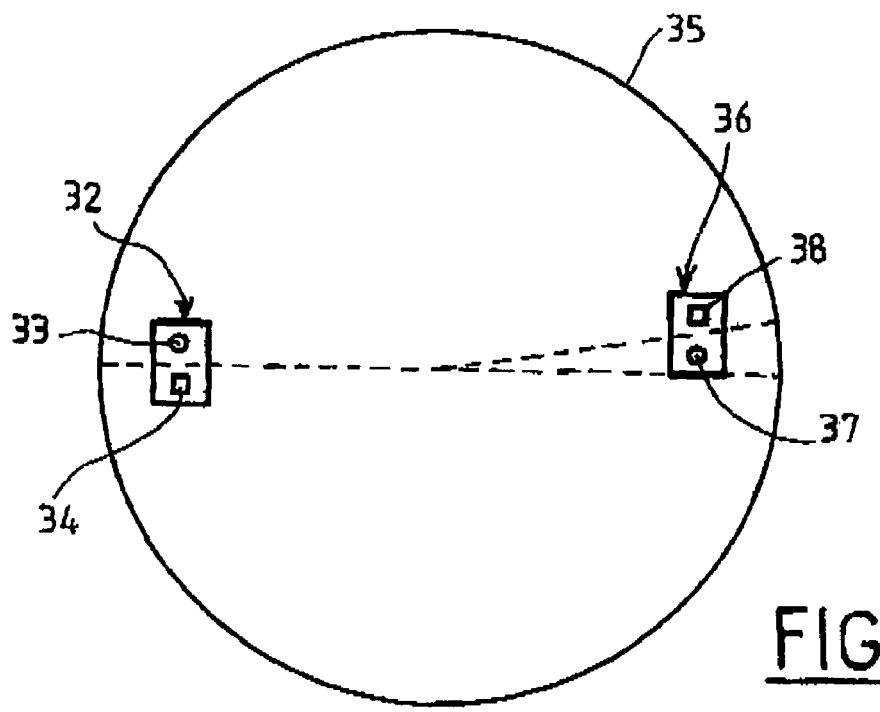
Figure 5:
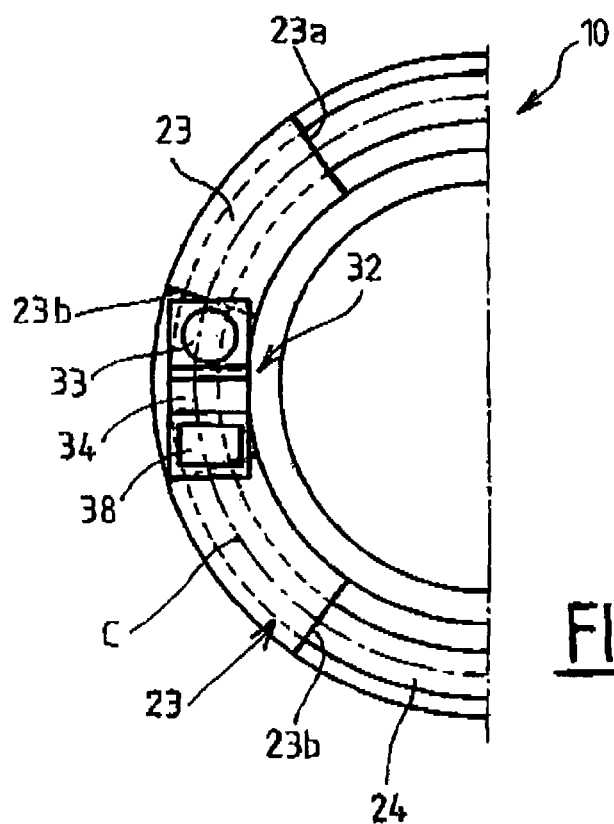
Figure 6:
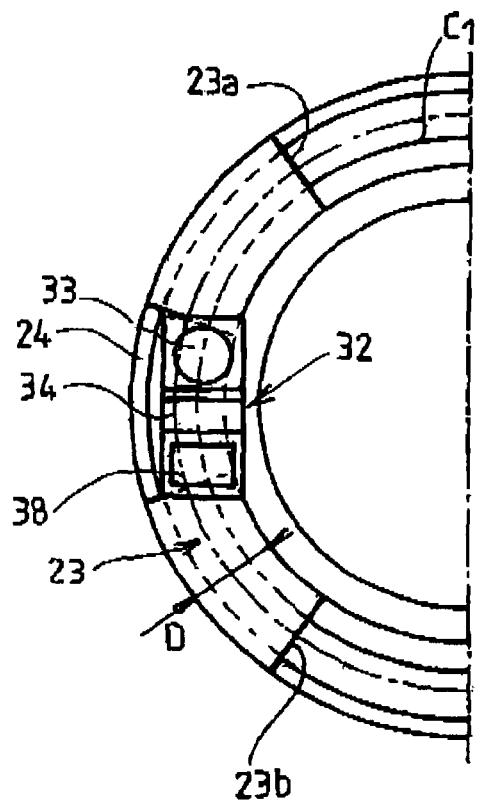
Figure 7:
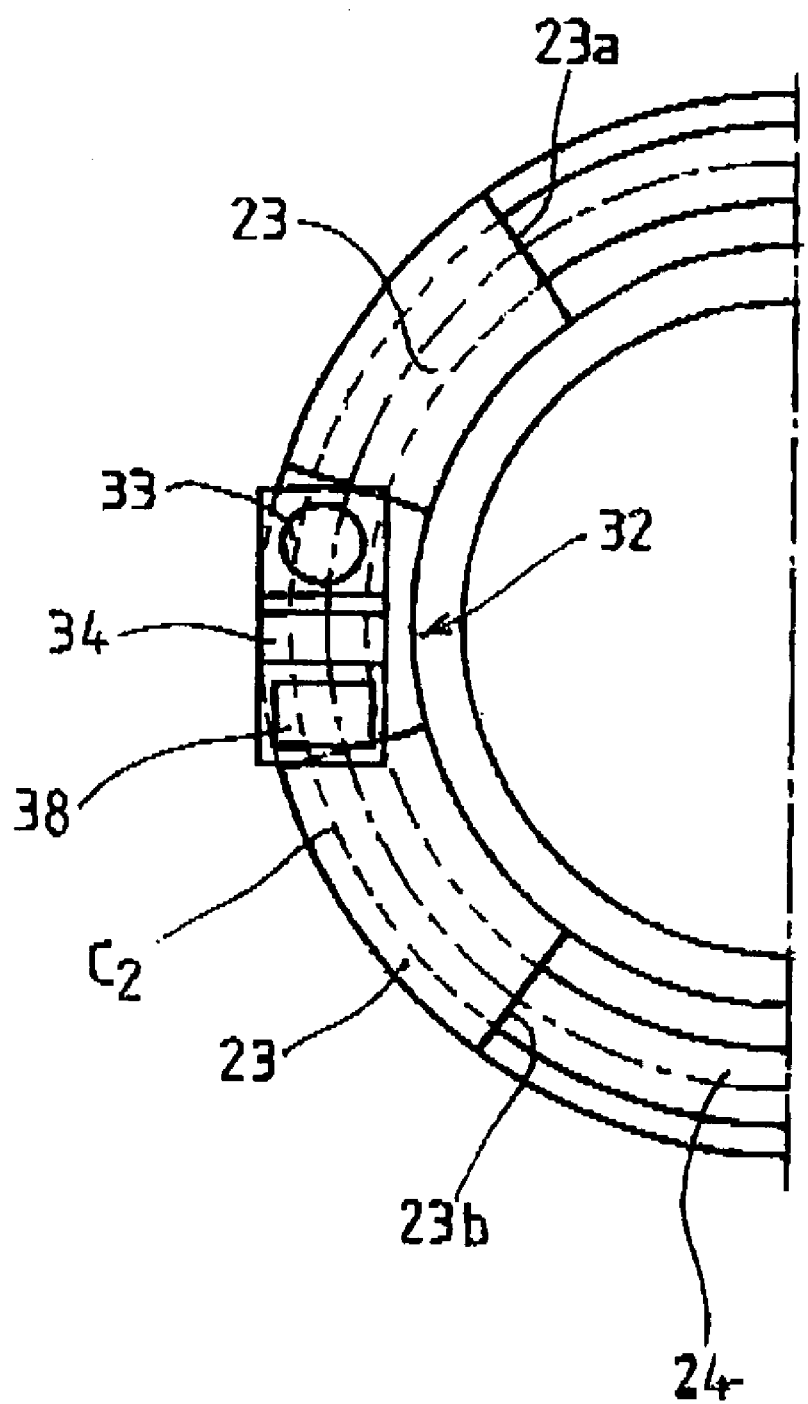

Further features, details and advantages of the invention will appear on a reading of the following description, which is made with reference to the attached drawings, which are given by way of example and which show, respectively:

in FIG. 1, a diagrammatic view in cross section of one example of a rotary knob in accordance with the present invention, and having a fixed part and a movable part which is rotatable, in FIG. 2, a view from underneath of the movable part seen in FIG. 1, in FIG. 3, a modified version of FIG. 2, in FIG. 4, a top plan view of the fixed part of the knob, in an embodiment which is modified from that in FIG. 1, and in FIGS. 5 to 7, half views, seen from above, of further modified embodiments of the knob in accordance with the present invention.

FIGS. 1 to 3 show a rotary knob 10 in accordance with the present invention. This knob 10 is, in this example, mounted on a control panel 1 of a motor vehicle cabin, in particular on a central console from which air conditioning adjustments, in particular, are carried out. The knob 10 serves in particular for control of a parameter which is related to a stream of air propelled by a ventilating, heating and/or air conditioning apparatus (not shown), for example the temperature or the flow rate or distribution of the said air stream. The knob constitutes an optical encoder and is described hereinafter.

To this end, the rotary control knob 10 includes a movable part 20, which is rotatable about an axis XX' which is substantially at right angles to the movable part, and a fixed part 30 which is made in the form of an electronic circuit board fixed on a base plate 1, the whole being typically mounted underneath a face of a control panel of a known type. The moving part 20 comprises a disc 21 which overlies a dome 22 that extends through an aperture in the face 2 and projects from the latter so as to be accessible by the driver or a passenger in the vehicle.

In this embodiment, an external surface 3 of the face 2 has icons or indications relating to the parameter to be adjusted, for example colour codes for the temperature of the air expelled, zones of the cabin which are represented in diagrammatic form, in order to symbolise de-icing and ventilating in the upper or middle zones or in the zone of the feet, or graphic or alphanumeric representations symbolising air flow rate.

As is shown in greater detail in FIG. 2, an internal surface 21b of the disc 21 has increments disposed radially in the form of a first crown 25 and a second crown 25', also referred to as the track. Each of these increments consists of a pair of elements comprising a projecting portion 23 or 23' arranged alternately with a recess 24 or 24'. The increment number is a function of the parameter being adjusted and of the desired result. This number is able to vary from a few units to a few hundreds, or even several thousand. The increments have a reflective surface, all of which are at least in the frequency band of the light used by the encoder. In the present case they are spaced apart at regular intervals. Each projecting portion 23 or 23' has a common radial dimension D or D' and a mean width L or L'.

The fixed portion 30 of the optical encoder knob 10 has an optical detection device 31, which, in the embodiment shown in FIGS. 1 and 2, comprises two optical sensors 32 and 36 which are offset radially from each other.

The optical sensor 32 has an emitter 33 for emitting light towards the disc 21, together with an optical receiver 34, and the sensor 36 has an emitter 37 for emitting light towards the disc 21, together with an optical receiver 38. The sensors 32 and 36 are connected to an electronic printed circuit board 35 for processing the information which is gathered.

The optical encoder knob 10 operates in the following way.

A first incident light beam, illustrated by the arrow E1, is emitted by the emitter 33 of the sensor 32 towards the internal surface 21b of the disc 21. According to whether the incident light beam E1 does or does not hit a projecting portion 23, a second light beam E2 is reflected at an angle such that it is either intercepted or otherwise by the optical receiver 34.

Thus, if the first incident light beam E1 hits a projecting portion 23, the optical receiver 34 intercepts the reflected second light beam E2, and a "1" binary signal is emitted in a digital processing circuit (not shown) of the electronic printed circuit board 35, thereby signifying that a projecting portion 23 has definitely been illuminated by the incident first light beam E1.

When the knob 10 rotates about the axis XX', whatever direction of rotation is chosen, the incident first light beam E1 then illuminates a recess 24, and the optical receiver 34 does not intercept the reflected second light beam E2, because, for example, the angle and/or the depth of the said recess 24 takes it out of the reception zone of the optical receiver 34. A binary "0" signal is then emitted by the digital processing circuit, signifying that the knob 10 has turned.

On continued rotation of the knob 10 in the same direction, the incident first light beam E1 once again hits a projecting portion 23 of the disc 21, and a binary "1" signal is then emitted in the digital processing circuit, signifying that the knob has continued to turn.

The first sensor 32, in collaboration with the incremental crown 25, thus permits the number of increments traversed by the disc 21 during its rotation to be determined, that is to say the number of turns or fractions of turns, and this without having regard to the direction of rotation.

As to the second sensor 36, this, in parallel with the operation of the first sensor 32, enables the direction of rotation of the knob 10 to be determined in collaboration with the second incremental crown 25', which is concentric with the first crown 25. To this end, the second sensor 36 is so located that a third incident light beam E3 is emitted by the emitter 37 towards the internal surface 21b of the disc 21, at the level of the second crown 25' as shown in FIG. 1.

This incident third light beam E3 is so positioned that, in an initial position in which the incident first light beam E1 hits a projecting portion 23, the third incident light beam E3 also illuminates a projecting portion 23' of the second incremental crown.

Thus, since the increments of the crowns 25 and 25' are offset circumferentially, for example from a projecting portion (or a recess), then, when the optical encoder knob 10 rotates:

either the first incident light beam E3 hits a recessed zone 24' of the second crown 25' and the first incident light beam E1 continues to illuminate the original projecting portion 23 (the direction of rotation being the direction R1 in FIG. 2);

or the incident third light beam E3 continues to illuminate the original projecting portion 23', and the first beam E1 quits the first increment and hits a recessed zone 24, the direction of rotation being the direction R2 in FIG. 2.

In the first case, a "0" signal is emitted by the second sensor 36 which has not received the reflected fourth light beam E4, and a signal 1 continues to be emitted by the first sensor 32 that receives the reflected second beam E2.

In the second case, a "1" signal continues to be emitted by the second sensor 36, because it receives the reflected fourth beam E4, and a "0" signal is emitted by the first sensor 32, which is no longer receiving the reflected second beam E2.

According to the sequence of "1" and "0" emitted, it is possible to determine immediately the direction of rotation R1 or R2 of the knob 10, shown in FIG. 2.

In an alternative solution illustrated in FIG. 3, there is only a single incremental crown 25, but the two sensors 32 and 36 are disposed very close to each other and offset circumferentially, in such a way that one of the incident beams E1 and E3 is directed towards an edge 23a of a projecting portion 23, and the other towards the other edge 23b. According to whether the sensors 32 and 36 are or are not receiving the second and fourth reflected light beams E2 and E4, a different sequence of "0" and "1" will be emitted as a function of the direction of rotation R1 or R2 of the knob 10.

The fact that two optical sensors 32 and 36 are employed thus enables the operation of the knob to be optimised, by detecting at the same time the direction of rotation and the angular variation of the rotation of the said knob, that is to say the magnitude of the step.

An alternative solution shown in FIG. 4 is to space the two sensors 32 and 36 away from each other, for example by putting them in substantially face-to-face relationship but also offsetting them slightly in the circumferential direction, by one half of a recess 24 or one half of a projecting portion 23, so that when the emitter 33 of the first sensor 32 points the first incident light beam E1 on to the edge 23a of the projecting portion 23 that it happens to be facing, the emitter 37 of the second sensor 36 points the incident third light beam E3 on to the edge 23b of the increment 23 which it happens to be facing.

The operation of this knob is identical to that in the preceding version, but it enables very fine increments to be obtained because the sensors are spaced apart. The sequences of "1" and "0" enable the direction of rotation R1 or R2 of the moving part 20 of the knob 10 to be determined, and also, of course, enable the fraction of turns traversed by the latter to be determined. It is in fact sufficient to offset the emitters circumferentially by n times one half of the mean width L of a projecting portion, n being an odd whole number greater than or equal to one, in order to obtain this result. An offset of 180° plus or minus one half of the mean width L of a projecting portion is accordingly shown in FIG. 4.

FIGS. 5 to 7 illustrate further modified embodiments in which the optical detection device 31 comprises a single sensor 32 which is equipped with a single light emitter 33, together with two optical receivers 34 and 38. The method of operation of this knob 10 is similar to the foregoing. The light emitter 33 emits a first incident light beam E1 towards the internal surface 21b of the disc 21. This incident first light beam E1 either does or does not hit a projecting portion 23 of the disc 21. If the first optical detector 34 intercepts the reflected second light beam E2, that will signify that the incident first light beam has illuminated a projecting portion 23, and a "1" binary signal is then emitted for reception by the first optical detector 34. Since the second optical detector 38 is offset circumferentially with respect to the first detector 34, then either the second reflected light beam is intercepted by the said second sensor 38, or else it is not. In the first case, that signifies that the knob is rotating in a first direction, while in the second case, it signifies that the knob is rotating in the other direction, in accordance with the sequence of "1" and "0" emitted.

In FIG. 5, the sensor 31 is located on a circle C passing substantially through the middle of the projecting portions 23. In FIGS. 6 and 7, the optical detection device 31 is offset radially, internally or externally, by more or less one half of the radial dimension D of each projecting portion 23, without this having any influence on the precision of measurement. For example, in the case in which each projecting portion measures substantially 2 millimeters radially, the sensor 32 in FIG. 6 is substantially located on a concentric circle C1, the radius of which is less than that of the nominal circle C by 1 millimeter, while in FIG. 7, the sensor 32 is substantially located on a concentric circle C2, the radius of which is greater than that of the nominal circle C by 1 millimeter. This solution enables any possible differences of alignment between the fixed part and the moving part of the knob 10 to be compensated for, these errors in alignment being mainly due to manufacturing and positioning tolerances of the components.

It must however by understood, of course, that the detailed description which is given only by way of illustration of the subject matter of the invention in no way constitutes any limitation, and that equivalent techniques can equally well be included within the field of the present invention.

Thus, it is possible to provide a much larger number of optical emitters and/or receivers. The sensors may be offset both circumferentially and radially from each other.

Similarly, it can be envisaged that only the projecting portion 23 or recess 24 is reflective.

In replacement for this "crenellated" type of optical encoder, it is also possible to arrange, on the internal surface 21b of the disc 21, portions which reflect the incident light at an angle such that the light emitted is received by a corresponding sensor, alternately with portions which reflect the incident light at another angle such that the light emitted from the receiving zone of the sensor is caused to pass out. To this end, it is possible to make use of zones with inclined facets, or, again, zones which are coated with materials having different refractive indices for the light.

The increments may be locally brought closer together circumferentially by greater or lesser amounts on their crown, in accordance with the degree of precision required, in particular as a function of the air parameter that is to be modified as the knob is turned. Thus, over for example a quarter of a turn, it may be desirable to have increments which are closer together, so as to give closer control of the flow rate or temperature of the air.

Similarly, the optical encoder is able to function on a transmission mode and no longer on a reflection mode, because of the positioning of the emitter or emitters on one side of the disc and the optical receptors on the other side of the disc, and because of the provision of the zones between the increments which are transparent to light rays emitted by the emitter or emitters.

The invention claimed is:

1. A motor vehicle control panel, having a face (2) having an aperture, and at least one rotatable knob (10) for adjustment of a parameter relating to a stream of air which is propelled by a ventilating, heating and/or air conditioning apparatus that at least partially extends through the aperture, wherein:

the rotatable knob (10) is an optical encoder comprising a rotatable part (20) and a fixed part (30) underneath the face of the control panel;

the rotatable part (20) of the optical encoder at least partially extends through the aperture and is passenger accessible, and the fixed part (30) is provided with an optical detection device (31) comprising; at least one light emitter (33; 37) for forming an incident light beam (E1; E3) directed towards the rotatable part (20); and at least two optical receivers (34, 38) capable of intercepting a second light beam (E2; E4) reflected off the rotatable part (20);

the rotatable part (20) comprises a plurality of radial incremental elements having a reflective surface and consisting of an alternate arrangement of projecting portions (23; 23') and recesses (24; 24');

the fixed part (30) is on a base plate (1) and the alternate arrangement of projection portions and recesses are found on apices or crowns (25, 25') of the radial incremental elements, and at least one crown faces the optical detection device (31);

and wherein the optical receivers (34, 38) are offset circumferentially in respect to one another in such a way that one of the optical receivers (34; 38) receives a light beam reflected by the moving part (21), while the other optical receiver (38; 34) receives none.

2. A control panel according to claim 1, wherein the projecting portions (23, 23') are spaced apart from each other at regular intervals.

3. A control panel according to claim 1, wherein the two sensors (32, 36) are substantially diametrically opposed.

4. A control panel according to claim 1, wherein the optical detection device (31) comprises a light emitter (33) and two optical receivers (34, 38) in a single block disposed close to each other and over a common circumference.

5. A control panel according to claim 4, wherein projecting portions (23; 23') have a radial dimension (D) which is constant, and the detection device (31) is adapted to be positioned with a radial outward or inward offset, from a position which is centered on the radial distance (D) up to one half of the radial dimension (D).

6. A motor vehicle control panel, having a face (2) having an aperture, and at least one rotatable knob (10) for adjustment of a parameter relating to a stream of air which is propelled by a ventilating, heating and/or air conditioning apparatus that at least partially extends through the aperture, wherein:

the rotatable knob (10) is an optical encoder comprising a rotatable part (2O) and a fixed art 30 underneath the face of the control panel;

the rotatable part (20) of the optical encoder at least partially extends through the aperture and is passenger accessible, and the fixed part (30) is provided with an optical detection device (31) comprising: at least one light emitter (33; 37) for forming an incident light beam (E1; E3) directed towards the rotatable part (20); and at least two optical receivers (34, 38) capable of intercepting a second light beam (E2; E4) reflected off the rotatable cart (20);

the rotatable part 20 comprises a plurality of radial incremental elements having a reflective surface and consisting of an alternate arrangement of projecting portions (23; 23') and recesses (24; 24');

the fixed part (30) is on a base plate (1) and the alternate arrangement of projection portions and recesses are found on apices or crowns (25, 25') of the radial incremental elements, and at least one crown faces the optical detection device (31); and wherein the parameter relating to the stream of air to be adjusted is selected from the group consisting of the temperature, flow rate and ejection zone of the stream of air.

7. A control panel according to claim 6, wherein the optical detection device (31) comprises a light emitter (33) and two optical receivers (34, 38) in a single block disposed close to each other and over a common circumference.

* * * * *